United States Patent
Roth

(10) Patent No.: US 6,396,314 B1
(45) Date of Patent: May 28, 2002

(54) ARRANGEMENT FOR THE WARBLING (SWEEPING) OF A FREQUENCY SYNTHESIZER

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/641,562

(22) Filed: Aug. 18, 2000

(30) Foreign Application Priority Data

Aug. 18, 1999 (DE) .......................... 199 39 036

(51) Int. Cl.[7] .............................. H03B 21/00
(52) U.S. Cl. ................ 327/107; 327/105; 327/106; 708/276
(58) Field of Search ................ 327/107, 105, 327/106; 708/276, 290

(56) References Cited

U.S. PATENT DOCUMENTS 4,144,579 A * 3/1979 Nossen et al. ............. 327/105
4,943,779 A * 7/1990 Pedersen et al. ........... 327/106
5,394,106 A * 2/1995 Black et al. ................ 327/107

FOREIGN PATENT DOCUMENTS

| DE | 2506081  | 8/1975  |
|----|----------|---------|
| DE | 3917510  | 11/1990 |
| DE | 4222105  | 2/1993  |
| DE | 3782847  | 5/1993  |
| DE | 4223257  | 1/1994  |
| DE | 4327136  | 8/1994  |
| DE | 19647474 | 5/1998  |

* cited by examiner

Primary Examiner—Dinh T. Le
(74) Attorney, Agent, or Firm—Birch, Stewart, Kolasch & Birch

(57) ABSTRACT

For sweeping a frequency synthesizer, which is digitally tunable in frequency in small steps to have a predetermined frequency progression over time, a clock signal of an accumulator generating digital adjustment values for the frequencies is controlled via a control circuit that is programmed corresponding to a desired frequency progression.

9 Claims, 1 Drawing Sheet

ARRANGEMENT FOR THE WARBLING (SWEEPING) OF A FREQUENCY SYNTHESIZER

BACKGROUND OF THE INVENTION

This application claims a foreign priority from German patent application 199 39 036.3, filed on Aug. 18, 1999, and the contents of that application are incorporated by reference herein.

This invention involves an arrangement for sweeping of a frequency synthesizer that is digitally tunable in frequency in small steps, through a predetermined progression of frequencies over time with an accumulator that is clocked and generates digital adjustment values for the frequencies.

In frequency synthesizers that are digitally tunable in frequency in small steps, which for example, operate according to a principle of so-called direct digital synthesis (DDS) or of fractional N-divisors, the task often arises of continuously tuning an output frequency in a predetermined progression over time, between a starting frequency and a stopping frequency, i.e. for warbling or sweeping. In a synthesizer with a fractional N-divisor in a reference branch (for example, according to German patent publication Offenlegungsschrift 196 47 474), an output frequency changes, for example, as a function of a reciprocal value of a division factor of a frequency divider controlled by a digital adjustment value, with a sweep speed corresponding to a derivative of the frequency with time; that is it changes as a function of the reciprocal value to the second power. If such a synthesizer is used in a spectrum analyzer, for example, in which measurement values are recorded, or should be to displayed, at equal frequency intervals, this is difficult for such characteristic lines. It is therefore desirable in a synthesizer of this type to maintain a constant sweep speed. Also, in other applications of such synthesizers, it is often desirable to generate a predetermined desired characteristic line progression between frequencies over time, for example, a logarithmic progression.

It is thus an object of this invention to provide an uncomplicated circuit arrangement, which makes it possible to set desired progressions of output frequencies of a synthesizer over time.

SUMMARY

According to principles of this invention, an arrangement for sweeping a frequency synthesizer that is digitally tunable in frequency in small steps to have a predetermined frequency progression over time, includes a clocked accumulator for generating digital adjustment values for the frequencies. The arrangement includes a control circuit which is programmed for controlling a clock signal of the accumulator to correspond to a desired frequency progression. Advantageous further embodiments result from inhancements.

BRIEF DESCRIPTION OF THE DRAWING

The invention is described and explained in more detail below using an embodiment shown in the drawing. The described and drawn features can be used individually or in preferred combinations in other embodiments of the invention. The foregoing and other objects, features and advantages of the invention will be apparent from the following more particular description of a preferred embodiment of the invention, as illustrated in the accompanying drawing in which reference characters refer to the same parts throughout. The drawing is not necessarily to scale, emphasis instead being placed upon illustrating principles of the invention in a clear manner.

The drawing.

DESCRIPTION OF THE PREFERRED EMBODIMENT

Figure 1:
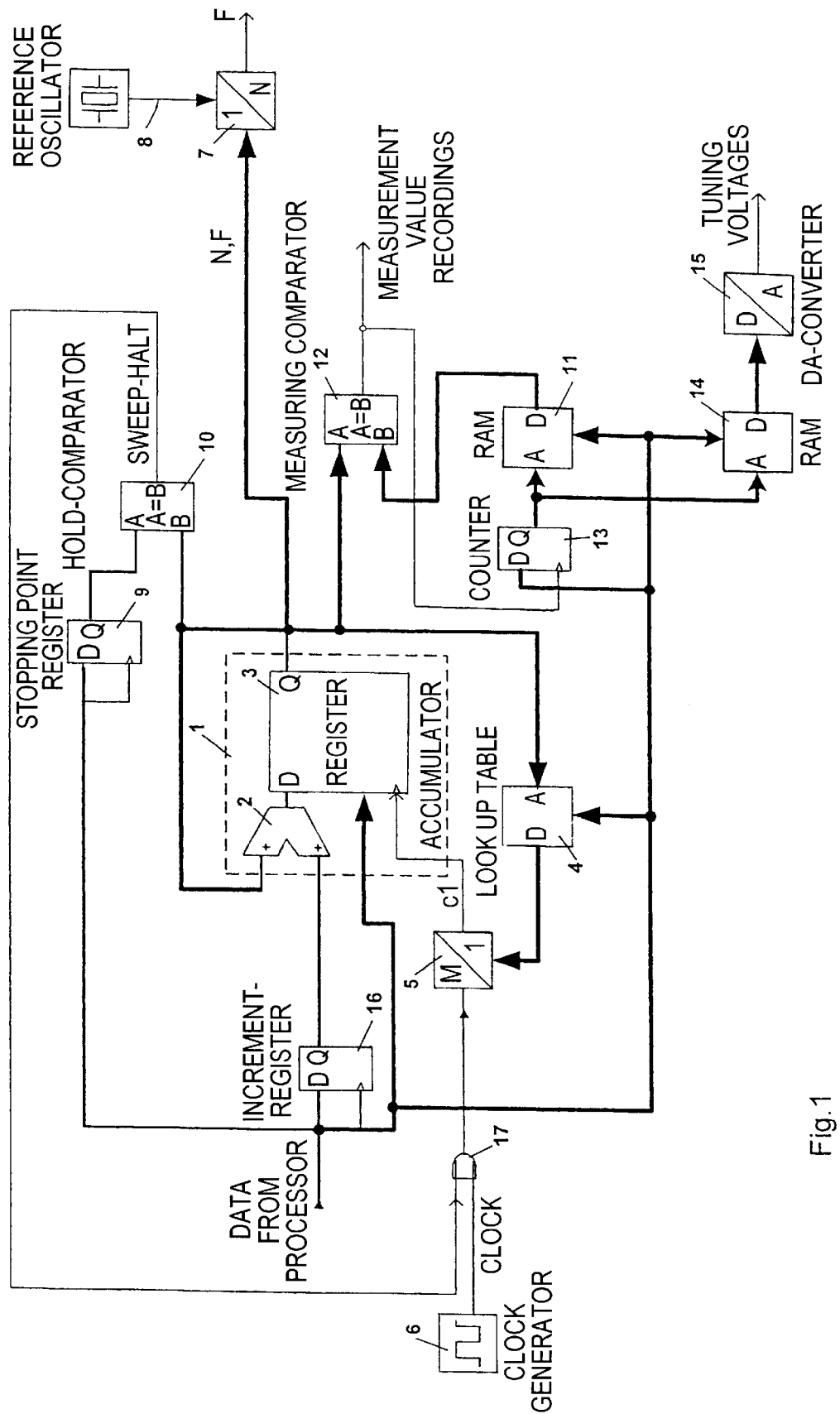
FIG. 1, is a schematic block diagram of an embodiment of the invention.

The figure shows a basic circuit diagram of a sweeping arrangement of the invention in connection with a synthesizer that operates according to the principle of fractional frequency division, with a frequency divider 7, adjustable in division ratios N, F, and an associated reference frequency branch 8 only being indicated schematically. In the example shown, the frequency divider 7 is thus arranged in the reference branch and divides the reference frequency; however, equally as well, the frequency divider could also be arranged in a phase-lock loop in a known manner.

A digital adjustment value N, F for the division factor of the frequency divider 7 is generated in an accumulator 1 including an adder 2 that has feed back via a register 3. Sweep-speed-determining number increments stored in an increment register 16 are added up in the adder 2 and accumulated in the register 3. A clock frequency c1 for triggering addition of the increments in the accumulator 1 is derived from a clock frequency source 6 via a frequency divider 5 having a division ratio 1/M from a relatively high reference frequency. The reference frequency is preferably selected approximately 20 to 100 times larger than the desired clock frequency c1 of the accumulator, it is, for example, 100 MHz.

The division factor M in the frequency divider 5 is set via a control circuit 4 (Look up table). In the application situation presented here, for a synthesizer with the frequency divider 7 in the reference branch 8, a constant sweep speed is to be achieved. An accuracy with which this can be achieved is determined by a size of the division factor M. For a division factor of 20, for example, the accuracy is better than 5%, which is sufficient in practice.

The control circuit 4 has a register, in which at respective register addresses, predetermined and previously-entered values are stored for the division factor M. The addresses of this register area are queried by instantaneous values at the output of the accumulator 1. In the embodiment mentioned, the frequency must be changed as a function of a reciprocal value of the division factor N, F of the frequency divider, so the relationship must be:

$$\text{Division factor } M = K/(N, F)^2$$

The value of the constant K is determined by the desired clock frequency c1, for K=10000 for example, a value M of 100 results for the frequency divider 5 at an accumulator value N, F=10, which then corresponds to a clock frequency of 1 MHz, which can be suppressed very well by the control loop of the synthesizer.

In order to sweep over an exactly defined frequency range, the division factor N, F for a start frequency is stored in a register of the accumulator 1. The division factor for a stop frequency is stored in an additional stopping point register 9, which is connected to a comparator 10, in which the instantaneous output value of the accumulator 1 is compared to this stop frequency value. If the accumulator value reaches this stop frequency value, the clock-frequency supplied to the divider 5 is interrupted via a control member 17.

In measuring devices, there is often a requirement for recording measurement values at exactly defined frequency points of a sweep. For this purpose, a register 11 (RAM) is provided, in which these desired frequency points are stored. An addressing of this register 11 is done via a counter 13, which is incremented by the measurement value requirements. At the beginning of the sweep, this counter 13 is adjusted to the address of a register cell for the first frequency point via the processor. When the output value of the accumulator 1 reaches the digital value that is stored in this register cell, a corresponding comparator 12 delivers a "1" at its output and thus indicates that the desired frequency has been reached. At the same time, transfer of the comparator from null to 1 also increments the counter 13, which then sends the next address for the register 11. The 1 at the output of the comparator 12 is thus reset again until the next frequency point is reached.

Parallel to the register 11 for measurement-value generation, a further register 14 can be provided, whose data delivers tuning voltages via a digital/analog/converter 15 at frequency points selected via the register 11. A stepping of the data of this additional register 14 is done synchronously with measurement value recording again via the counter 13. These voltages generated at predetermined frequency values can be freely programmed by the processor and used for frequency response correction or the like.

The size of the increment in the increment register 16 determines a sweep speed, the start and stop frequencies are determined by the corresponding register values.

With this invention, a predetermined progression of an output frequency of a synthesizer can be set over time in a simple way by changing the clock frequency of the accumulator that generates the digital reference variable. The arrangement of the invention is thus suitable for all known synthesizer systems, both for those which operate according to the DDS principle or with fractional N-divisors, where in the latter case, the N-divisor can be arranged either in a regulation loop or in a reference branch. When using this type of synthesizer of the invention in a spectrum analyzer, a corresponding measurement value can be determined at any predetermined frequency points; moreover, it is possible at the same time to generate additional analog tuning voltages at predetermined frequency points of a characteristic line, which can be used for frequency response correction of the spectrum analyzer, for tuning filters, or the like. An arrangement of the invention also operates considerably faster than would be possible by direct control from a processor, which moreover, is free for other tasks.

The invention claimed is:

1. Circuit for sweeping an output of a frequency synthesizer that is digitally tunable in frequency in small steps to have a predetermined frequency progression over time, said circuit including:
   a clocked accumulator receiving an accumulator clock signal from a clock source for generating output digital adjustment values and feeding the output digital adjustment values to the frequency synthesizer for determining the output frequencies of the frequency synthesizer, wherein said arrangement further comprises a control circuit (4) which is programmed for controlling the clock source responsive to the predetermined frequency progression and said output digital adjustment values.

2. Circuit of claim 1, wherein the clock source includes clock frequency divider (5) and wherein said control circuit (4) controls a clock source frequency (c1) from said clock frequency divider (5) for generating the accumulator clock signal for the accumulator (1).

3. Circuit of claim 1, wherein the desired frequency progression is stored in the control circuit (4), with signals corresponding to the output digital adjustment values of the accumulator being fed to respective addresses of a register of the control circuit (4), and wherein predetermined data respectively stored at these addresses, correspondingly adjusts the accumulator clock signal.

4. Circuit of claim 1, wherein a digital value for a start frequency is stored in the accumulator (1).

5. Circuit of claim 1, wherein a digital value for a stop frequency is stored in a stopping point register (9) which is connected to a comparator (10) for comparing the stop frequency with a signal corresponding to the output digital adjustment values, and interrupting the clock signal when the accumulator's output digital adjustment value reaches a stored value in the stopping point register (9).

6. Circuit of claim 1 for an electronic measurement device wherein digital values for predetermined frequency points are stored in a register (11), which is connected to a comparator (12), which when there is agreement between a signal corresponding to the output digital adjustment value of the accumulator (1) with one of these stored digital values, at least one of a separate measurement value is noted in a measurement device and generation of a separate tuning voltage is triggered.

7. Circuit of claim 6, wherein a counter (13) is assigned to the register (11), and this counter steps the register (11) to a next stored frequency value after triggering the at least one of the measurement value determination and the tuning voltage at one of the stored frequency points.

8. Circuit of claim 6, wherein predetermined tuning voltage values associated with the predetermined frequency values are stored in an additional register (14).

9. A frequency synthesizer apparatus including a frequency synthesizer and the circuit of claim 1 for sweeping the frequency synthesizer wherein said frequency synthesizer operates according to a principle of fractional frequency synthesis, having a frequency divider (7) that is set to integer division ratios in a reference branch (8), and which is set by the output digital adjustment values generated in the accumulator, wherein the accumulator clock frequency of the accumulator (1) is controlled by the control circuit (4) so that it changes as reciprocal values ($1/N^2$) of the adjustment values (N, F) of the frequency divider (7).

* * * * *